United States Patent
Pei

(10) Patent No.: US 8,475,595 B2
(45) Date of Patent: Jul. 2, 2013

(54) COATING SYSTEM

(75) Inventor: Shao-Kai Pei, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 473 days.

(21) Appl. No.: 12/880,164

(22) Filed: Sep. 13, 2010

(65) Prior Publication Data
US 2011/0259266 A1 Oct. 27, 2011

(30) Foreign Application Priority Data
Apr. 22, 2010 (TW) .............................. 99112620 A

(51) Int. Cl.
*C23C 14/24* (2006.01)
(52) U.S. Cl.
USPC ............................ 118/715; 118/726; 118/730
(58) Field of Classification Search
USPC .............. 118/715, 723 VE, 723 CB, 723 EB, 118/726, 730
See application file for complete search history.

(56) References Cited

U.S. PATENT DOCUMENTS

| | | | | |
|---|---|---|---|---|
| 4,583,488 A | * | 4/1986 | Brown et al. | 118/500 |
| 5,190,590 A | * | 3/1993 | Suzuki et al. | 118/664 |
| 5,888,305 A | * | 3/1999 | Szczyrbowski et al. | 118/723 EB |

* cited by examiner

*Primary Examiner* — Laura Edwards
(74) *Attorney, Agent, or Firm* — Altis Law Group, Inc.

(57) ABSTRACT

A coating system includes a housing, a coating umbrella, a rotatable assembly, a lift driver, a solvent storage chamber, and a jet device. The housing includes a block dividing the housing into a coating chamber and a painting chamber. The coating umbrella is configured for receiving a number of workpieces. The rotatable assembly is connected to the coating umbrella to drive the rotatable assembly to rotate. The lift driver lifts the rotatable assembly to switch the position of the coating umbrella between the coating chamber and the spray painting chamber. The solvent storage chamber is configured for storing paint solvent. The solvent storage chamber communicates with the painting chamber. The jet device is received in the solvent storage chamber, and communicated with the painting chamber to spray the paint solvent onto the workpieces.

10 Claims, 3 Drawing Sheets

COATING SYSTEM

BACKGROUND

1. Technical Field

The disclosure relates to coating technology and, particularly, to a coating system.

2. Description of Related Art

Infrared (IR) cut-off filters reflect or block light of mid-infrared wavelengths while passing visible light and are generally equipped in cameras. The IR cut-off filters are manufactured by forming IR cut-off films on workpieces by a coating process and a spray-paint process. Generally, after the coating process is finished, operators must move the workpieces to a painting device to conduct the spray-paint process on the workpieces. Thus, the processes are time-consuming and inefficient.

Therefore, it is desirable to provide a coating system which can overcome the above problems.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Embodiments of the present disclosure will now be described in detail below and with reference to the drawings.

Figure 1:
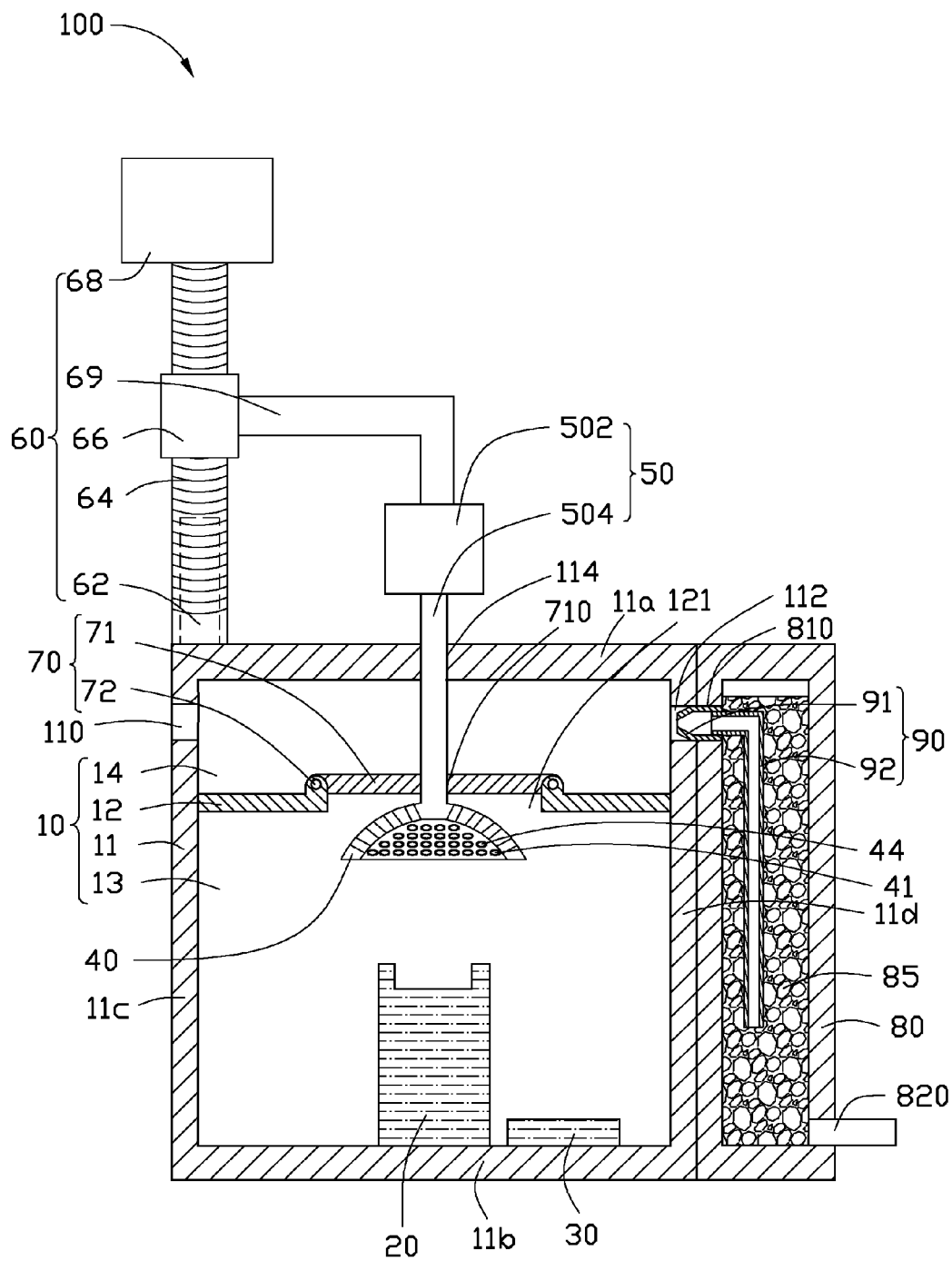
FIG. 1 is a schematic view of a coating system, according to a first exemplary embodiment.

Referring to FIG. 1, a coating system 100, according to a first exemplary embodiment, includes a housing 10, an ion source 20, an evaporator 30, a coating umbrella 40, and a rotatable assembly 50, a lift driver 60, a gate structure 70, a solvent storage chamber 80, and a jet device 90.

The housing 10 includes a shell 11 and a block 12. The block 12 is positioned in the shell 11 and divides an inner space of the shell 11 into a coating chamber 13 and a painting chamber 14. The block 12 defines an opening 121 generally at the middle thereof. The coating chamber 13 communicates with the painting chamber 14 by the opening 121. The shell 11 includes a top wall 11a, a bottom wall 11b opposite to the top wall 11a, a first sidewall 11c, and a second sidewall 11d. The first sidewall 11c and the second sidewall 11d are respectively perpendicular to and connected to the top wall 11a and the bottom wall 11b. The first sidewall 11c is opposite to the second sidewall 11d. The top wall 11a defines a circular hole 114. A top end of the first sidewall 11c, closed to the top wall 11a defines an air-exhaust hole 110 for communication of the painting chamber 14 with the outside of the housing 10. The second sidewall 11d defines a first through hole 112.

Both the ion source 20 and the evaporator 30 are received in the coating chamber 13 and positioned on the bottom wall 11b. The ion source 20 and the evaporator 30 are arranged adjacent to each other. The evaporator 30 is configured for heating a target material emitted by the ion source 20 into a steamy state.

The coating umbrella 40 includes a number of receiving holes 41. Each of the receiving holes 40 receives a workpiece 44. The workpiece 44 may be a lens or a metal substrate. The largest end of the coating umbrella 40 is equal to or slightly smaller than the size of the opening 121 of the block 12.

The rotatable assembly 50 includes a main body 502 and a rotor shaft 504. One end of the rotor shaft 504 runs through the circular hole 114 of the top wall 11a and is connected to the coating umbrella 40, and the other end is coupled to the main body 502. Driven by the main body 502, the rotor shaft 504 rotates with respect to the main body 502. As a result, the rotation of rotor shaft 504 drives the coating umbrella 40 to rotate in the housing 10.

The lift driver 60 includes a location pole 62, a rotatable pole 64, a sliding ring 66, and a first motor 68. The location pole 62 is extended upward from the top wall 11a. The rotatable pole 64 is hollow, and has external threads (not labeled). One end of the rotatable pole 64 sleeves about the location pole 62, and the other end is connected to the first motor 68. The rotatable pole 64 is rotated about the location pole 62 driven by the first motor 68. The sliding ring 66 has internal threads (not shown) meshed with the external threads. The sliding ring 66 is connected to the main body 502 of the rotatable assembly 50 by a connection pole 69. As a result, when the first motor 68 drives the rotatable pole 64 to rotate, the sliding ring 66 is forced to slide on the rotatable pole 64, and thereby the coating umbrella 40 also can move upward or downward along with the rotatable pole 64 and thus can switch position between the coating chamber 13 and the painting chamber 14.

The gate structure 70 includes two gates 71 and two second motors 72. The two second motors 72 are respectively positioned on the block 12 along the two opposite sides of the opening 121 and respectively coupled to the two gates 71. The two gates 71 are capable of rolling-over with respect to the block 12 to close or open the opening 121 of the block 12. Each of the two gates 71 defines a semicircular through hole (not labeled). When the two gates 71 are driven by the two second motors 72 to close the opening 121, the two semicircular through holes cooperatively form a through hole 710 for and fittingly accommodating the rotor shaft 504 of the rotatable assembly 50.

The solvent storage chamber 80 is positioned in contact with the second sidewall 11d and defines a second through hole 810 communicating with the first through hole 112. The solvent storage chamber 80 and the painting chamber 14 communicate with each other by the second through hole 810 and the first through hole 112. The solvent storage chamber 80 stores the paint solvent 85. The solvent storage chamber 80 also defines a sprue 820 for infusing paint solvent 85.

The jet device 90 includes a nozzle 91 and a pipe 92. The nozzle 91 extends into the first through hole 112 and the second through hole 810. One end of the pipe 92 is connected to the nozzle 91, and the other end is inserted into the solvent storage chamber 80. The jet device 90 sprays paint solvent 85 onto the workpieces 44.

Figure 2:
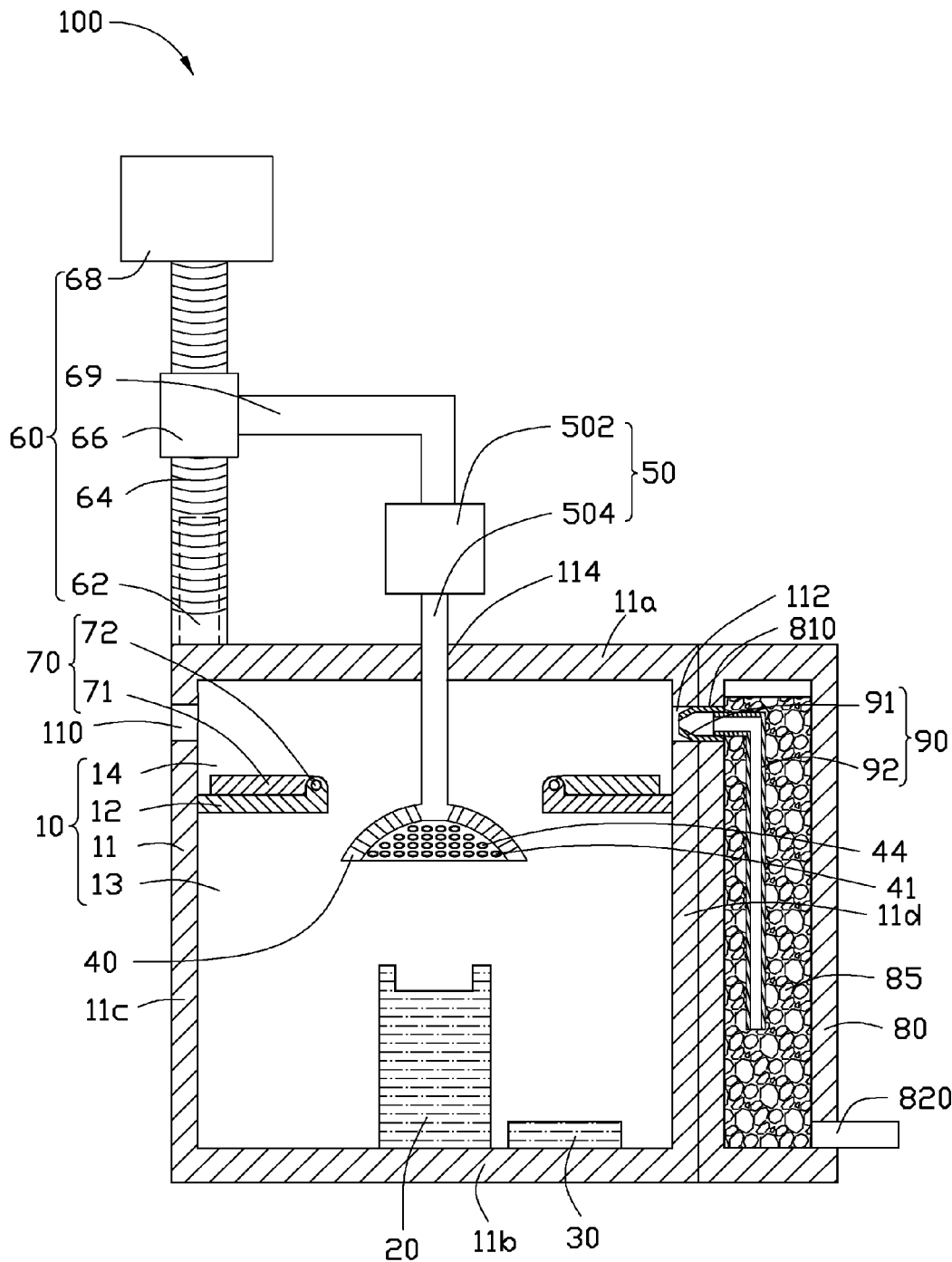
FIG. 2 is similar to FIG. 1, but showing the coating system in an operating state.

Also referring to FIG. 2, during the process of coating, the second motors 72 rotate to roll up the gates 71 to open the opening 121 of the block 12. Then, the housing 10 is vacuumized by the air-exhaust hole 110. Next, the second motors 72 rotates in an inverse direction to roll down the gates 71 to close the opening 121 of the block 12, the ion source 20 sprays the target material, and the evaporator 30 heats the target material sprayed by the ion source 20 into steam. At the same time, the rotatable assembly 50 drives the coating umbrella 40 to rotate in the coating chamber 13. As a result, the workpieces 44 are coated with a desired film on the surface, such as IR cut-off film. Then, the second motors 72 are activated again to roll up the gates 71 to open the opening 121 of the block 12, The lift driver 60 lifts the coating umbrella 40 to the painting chamber 14. Then, the jet device 90 is turned on, the rotatable assembly 50 drives the coating umbrella 40 to rotate in the painting chamber 14, and the nozzle 91 sprays the paint solvent 85 onto the workpieces 44 to form a waterproof film.

Figure 3:
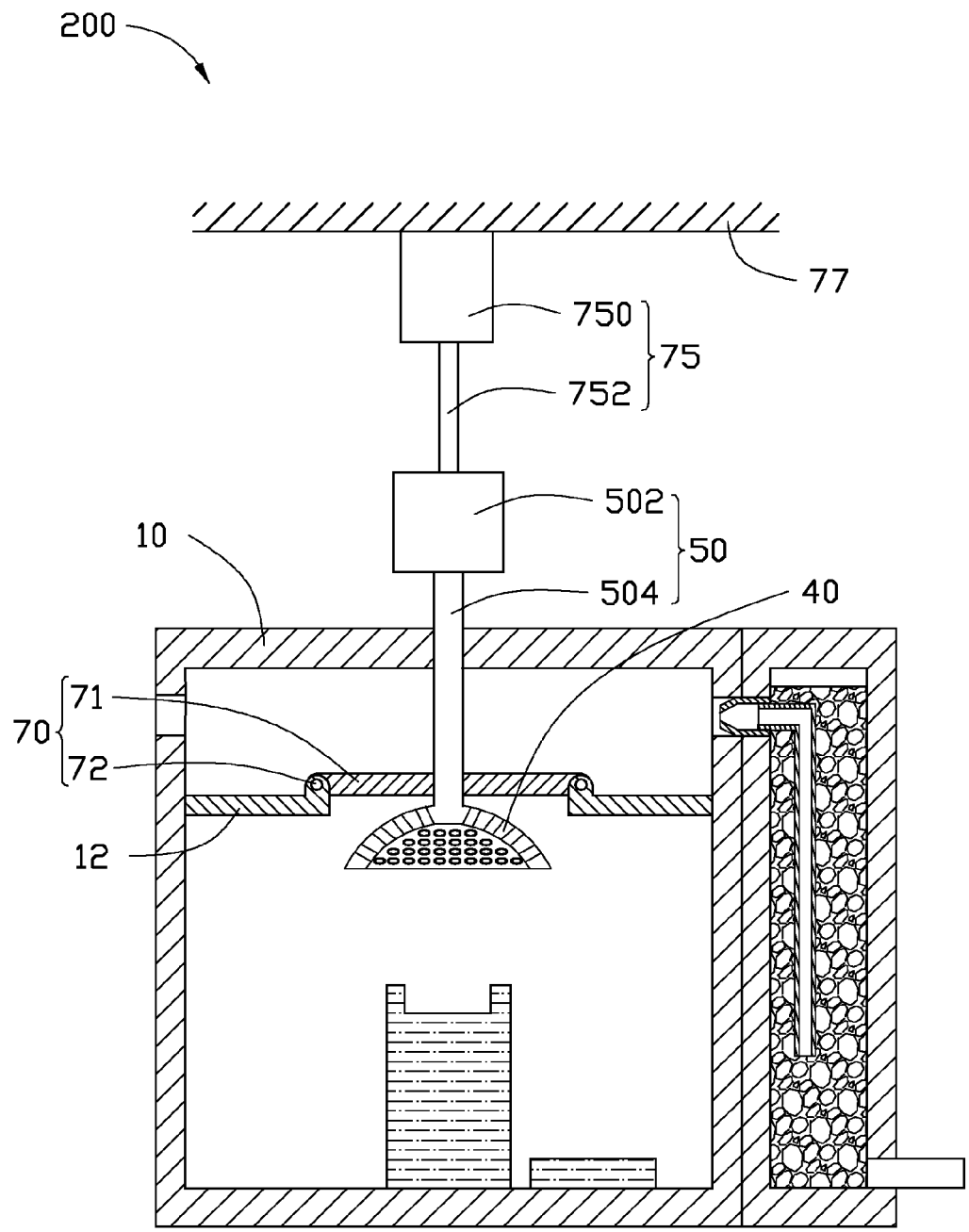
FIG. 3 is a schematic view of a coating system, according to a second exemplary embodiment.

FIG. 3 illustrates a coating system 200 in accordance with a second exemplary embodiment. The coating system 200 is essentially similar to the coating system 100 of the first embodiment except a lift driver 75. In the present embodiment, the lift driver 75 is a cylinder, and includes a cylinder body 750 and a movable rod 752. One end of the movable rod 752 is coupled to the cylinder body 750 and the other end is connected to the main body 502 of the rotatable assembly 50. The cylinder body 750 is positioned on a fixed board 77 above the housing 10. Therefore, the movement of the movable rod 752 enables the rotatable assembly 50 to move up or down and thus switch itself between the coating chamber 13 and the painting chamber 14.

As compared to typical coating systems, the coating systems 100 and 200 are capable of conducting both the coating process and the spray-paint process without transportation of the workpieces 44 and thus the workpieces 44 are prevented from being contaminated.

It is understood that the above-described embodiment are intended to illustrate rather than limit the disclosure. Variations may be made to the embodiment without departing from the spirit of the disclosure. Accordingly, it is appropriate that the appended claims be construed broadly and in a manner consistent with the scope of the disclosure.

What is claimed is:

1. A coating system comprising:
    a housing comprising a block, the block dividing the housing into a coating chamber and a painting chamber, the block defining an opening, the coating chamber communicating with the painting chamber through the opening;
    an ion source and an evaporator, both the ion source and the evaporator received in the coating chamber, the ion source configured to spray a target material, the evaporator configured to heat the target material being sprayed by the ion source into a steamy state;
    a coating umbrella for receiving a plurality of workpieces;
    a rotatable assembly connected to the coating umbrella to drive the rotatable assembly to rotate;
    a lift driver configured for lifting the rotatable assembly to switch the position of the coating umbrella between the coating chamber and the spray painting chamber;
    a solvent storage chamber configured for storing paint solvent, the solvent storage chamber communicated with the painting chamber;
    a jet device received in the solvent storage chamber, and communicated with the painting chamber to spray the paint solvent onto the workpieces; and
    a gate structure comprising two gates and two second motors, wherein the two second motors are respectively positioned on the block along two opposite sides of the opening and respectively coupled to the two gates, the two gates are capable of rolling-over with respect to the block to close or open the opening of the block, each of the two gates defines a semicircular through hole, when the two gates are driven by the two second motors to close the opening, the two semicircular through holes cooperatively form a second through hole for fittingly accommodating the rotor shaft of the rotatable assembly.

2. The coating system of claim 1, wherein the block defines the opening generally at the middle thereof.

3. The coating system of claim 2, wherein the housing defines a circular hole in a top wall thereof, the rotatable assembly comprises a main body and a rotor shaft, one end of the rotor shaft runs through the circular hole of the top wall and is connected to the coating umbrella, and the other end is coupled to the main body.

4. The coating system of claim 3, wherein the housing comprises a shell having the top wall, the lift driver comprises a location pole, a rotatable pole, a sliding ring, and a first motor, the location pole is extended upward from the top wall, the rotatable pole is hollow and has external threads, one end of the rotatable pole is sleeved about the location pole, and the other end is connected to the first motor, the rotatable pole is capable of being rotated about the location pole driven by the first motor, the sliding ring has internal threads meshed with the external threads, the sliding ring is connected to the main body of the rotatable assembly by a connection pole.

5. The coating system of claim 4, wherein the shell further comprises a bottom wall opposite to the top wall, a first sidewall, and a second sidewall, the first sidewall and the second sidewall are respectively perpendicular to and connected to the top wall and the bottom wall, the first sidewall is opposite to the second sidewall, a top end of the first sidewall closed to the top wall defines an air-exhaust hole configured for communicating the painting chamber with the outside of the housing.

6. The coating system of claim 5, wherein the second sidewall defines a first through hole, the solvent storage chamber is positioned in contact with the second sidewall, and defines a second through hole communicating with the first through hole, the jet device comprises a nozzle and a pipe, the nozzle extends into the first through hole and the second through hole, one end of the pipe is connected to the nozzle, and the other end of the pipe is inserted into the solvent storage chamber, the jet device is configured for spray the paint solvent onto the workpieces.

7. The coating system of claim 1, wherein the solvent storage chamber defines a sprue configured for infusing the paint solvent.

8. The coating system of claim 5, wherein both the ion source and the evaporator are positioned on the bottom wall.

9. The coating system of claim 2, wherein the largest end of the coating umbrella is equal to or slightly smaller than the size of the opening of the block.

10. The coating system of claim 1, wherein the lift driver is a cylinder and comprises a cylinder body and a movable rod, one end of the movable rod is coupled to the cylinder body, and the other end of the movable rod is connected to the rotatable assembly, the cylinder body is positioned above the housing.

* * * * *